US008575659B1

(12) United States Patent
Bui et al.

(10) Patent No.: US 8,575,659 B1
(45) Date of Patent: Nov. 5, 2013

(54) CARBON-BERYLLIUM COMBINATIONALLY DOPED SEMICONDUCTOR

(75) Inventors: Steven S. Bui, Simi Valley, CA (US); Tahir Hussain, Malibu, CA (US); James Chingwei Li, Simi Valley, CA (US)

(73) Assignee: HRL Laboratories, LLC, Malibu, CA (US)

( * ) Notice: Subject to any disclaimer, the term of this patent is extended or adjusted under 35 U.S.C. 154(b) by 124 days.

(21) Appl. No.: 13/209,395

(22) Filed: Aug. 13, 2011

(51) Int. Cl.
*H01L 29/66* (2006.01)
*H01L 21/8249* (2006.01)

(52) U.S. Cl.
USPC ............ 257/197; 257/40; 257/183; 257/191; 257/E29.033; 257/E29.089; 257/E51.015; 257/E21.371; 257/E21.372; 438/99; 438/235

(58) Field of Classification Search
USPC .................... 257/40, 183, 191, 197, E29.033, 257/E29.089, E51.015, E21.371, E21.3, 72; 438/99, 235
See application file for complete search history.

(56) References Cited

U.S. PATENT DOCUMENTS

| | | | |
|---|---|---|---|
| 4,632,710 A | 12/1986 | Van Rees | |
| 5,116,455 A | 5/1992 | Daly | |
| 5,321,302 A * | 6/1994 | Shimawaki | 257/592 |
| 5,371,389 A * | 12/1994 | Matsuno et al. | 257/197 |
| 5,407,491 A | 4/1995 | Freundlich et al. | |
| 5,949,097 A * | 9/1999 | Hirata et al. | 257/198 |
| 6,147,371 A * | 11/2000 | Tanaka | 257/197 |
| 6,426,522 B1 | 7/2002 | Kean et al. | |
| 6,653,248 B2 * | 11/2003 | Kean et al. | 438/22 |
| 6,750,482 B2 * | 6/2004 | Seaford et al. | 257/191 |
| 7,494,887 B1 | 2/2009 | Hussain | |
| 7,531,851 B1 | 5/2009 | Rajavel et al. | |
| 7,576,409 B1 | 8/2009 | Chen et al. | |
| 7,655,529 B1 | 2/2010 | Chen et al. | |
| 7,704,824 B2 | 4/2010 | Seaford et al. | |
| 7,915,625 B2 * | 3/2011 | Karino et al. | 257/94 |
| 2002/0149030 A1* | 10/2002 | Kean et al. | 257/191 |
| 2003/0201460 A1* | 10/2003 | Seaford et al. | 257/197 |
| 2004/0104403 A1* | 6/2004 | Moll et al. | 257/183 |
| 2008/0132047 A1 | 6/2008 | Dunne et al. | |
| 2010/0006777 A1 | 1/2010 | Kretzer et al. | |
| 2010/0163926 A1 | 7/2010 | Hudait et al. | |

OTHER PUBLICATIONS

S. R. Bahl et al, "Be Diffusion in InGaAs/InP Heterojunction Bipolar Transistors," IEEE Electron Device Letters, vol. 21, No. 7, Jul. 2000, pp. 332-334.

(Continued)

*Primary Examiner* — Victor A Mandala
(74) *Attorney, Agent, or Firm* — North Shore Associates

(57) ABSTRACT

A combinationally doped semiconductor layer, a double heterojunction bipolar transistor (DHBT) including a combinationally doped semiconductor layer, and a method of making a combinationally doped semiconductor layer employ a combination of carbon and beryllium doping. The combinationally doped semiconductor layer includes a first sublayer of a semiconductor material doped substantially with beryllium and a second sublayer of the semiconductor material doped substantially with carbon. The DHBT includes a carbon-beryllium combinationally doped semiconductor layer as a base layer. The method of making a combinationally doped semiconductor layer includes growing a first sublayer of the semiconductor layer, the first sublayer being doped substantially with beryllium and growing a second sublayer of the semiconductor layer, the second sublayer being doped substantially with carbon.

20 Claims, 4 Drawing Sheets

(56) References Cited

OTHER PUBLICATIONS

M. Borgarino et al., "The Reliability of III-V semiconductor Heterojunction Bipolar Transistors," GAAS 2000 Conference Proceedings Microwave Eng, 2000, p. 1-10.

M. Borgarino et al., "Reliability physics of compound semiconductor transistors for microwave applications," Microelectronics Reliability, vol. 41, 2000, pp. 21-30.

T. P. Chin et al., "Highly carbon-doped p-type Ga0.5In0.5As and Ga0.5In0.5P by carbon tetrachloride in gas-source molecular beam epitaxy," Appl. Phys. Lett., vol. 59, No. 22, 1991, pp. 2865-2867.

P. M. DeLuca et al.,"Carbon Doped InP/InGaAs Heterojunction Bipolar Transistors Grown by MOCVD," GAAS 2001 European Gallium Arsenide and Related III-V Compounds Application Symposium, 2001, pp. 29-32.

A. Henkel et al., "Single and double heterojunciton bipolar transistors in collector-up topology," GAAS 1998 Gallium Arsenide Applications Symposium, 1998, pp. 703-708.

S. L. Jackson et al., "Influence of AsH3 cracking temperature on the H passivation of C acceptors in In0.53Ga0.47As grown by beam epitaxy techniques," Appl. Phys. Lett., vol. 69, No. 13, 1996, pp. 1939-1941.

S. Krishnan et al., "InP/InGaAs/InP Double Heterojunction Bipolar Transistors with 300 GHz Fmax," Conference Proceedings, 2001 International Conference Indium Phosphate and Related Materials, 13th IPRM, 2001, TuB1-2, pp. 31-34.

H. C. Kuo et al., "Growth of carbon doping Ga0.47In0.53As using CBr4 by gas source molecular beam epitaxy for InP/InGaAs heterojunction bipolar transistor applications," J. Vac. Sci. Technol. vol. B 17, No. 3, 1999, pp. 1185-1189.

H. Livingston, "A Survey of Heterojunction Bipolar Transistor (HBT) Device Reliability," IEEE Trans Components and Packaging Technologies, vol. 27, No. 1, 2004, pp. 225-228.

D. I. Lubyshev et al., "Molar fraction and substrate orientation effects on carbon doping in InGaAs grown by solid source molecular beam epitaxy using carbon tetrabromide," J. App. Phys., vol. 84, No. 8, 1998, 4281-4284.

R. Magno et al., "InAlAsSb/InGaSb double heterojunction bipolar transistor," Electronic Letters, vol. 41, No. 6, 2005.

D. Sawdai et al., "Performance Optimization of PNP InAlAs/InGaAs HBTs," 16th Biennial IEEE/Cornell University Conference on Advanced Concepts in High-Speed Semiconductor Devices and Circuits, 1997, pp. 269-277.

D. Sawdai et al., "Power Performance of PNP InAlAs/InGaAs HBTs," 10th International Conference on Indium Phosphide and Related Materials, 1998, pp. 72-75.

S. Topaloglu et al., "The Effect of Collector Doping on InP-Based Double Heterojunction Bipolar Transistors," Turk J Elec Engin, vol. 14, No. 3, 2006, pp. 429-436.

Veeco, "Solutions for Carbon Doping," http://www.veeco.com/pdfs/datasheets/DATASHEET_solutions%20for%20carbon%20doping%20(9-09B).pdf, 2009.

* cited by examiner

CARBON-BERYLLIUM COMBINATIONALLY DOPED SEMICONDUCTOR

CROSS-REFERENCE TO RELATED APPLICATIONS

N/A

STATEMENT REGARDING FEDERALLY SPONSORED RESEARCH OR DEVELOPMENT

N/A

BACKGROUND

Beryllium is a commonly used material employed as an acceptor to produce p-type semiconductors. For example, beryllium as a p-type dopant may be used to produce p-type III-V semiconductors such as, but not limited to, p-type gallium arsenide (pGaAs), p-type indium gallium arsenide (pInGaAs) and p-type aluminum gallium arsenide (pAlGaAs). P-type III-V semiconductors may be used as a base layer for an NPN heterojunction bipolar transistor (HBT), for example.

However while common, beryllium doping may present certain disadvantages in practice. For example, beryllium is known to diffuse within a semiconductor lattice, especially when under stress due to an electrical bias at elevated temperature. Moreover, while a beryllium-doped semiconductor layer used in a base layer of an NPN HBT may yield relatively high current gain and good carrier mobility, the beryllium-doped semiconductor layer may also exhibit relatively low carrier concentrations, relatively high resistivity and in some instances, a high base-emitter turn-on voltage ($V_{BE}$) due to beryllium diffusion, for example. In addition, a frequency performance of a device (e.g., HBT) may be relatively poor when beryllium doping is employed.

Carbon is often cited as an attractive alternative to beryllium for the p-type doping of III-V semiconductors. For example, carbon may be more stable than beryllium as a dopant since carbon atoms are large and thus are less likely than beryllium to suffer from diffusion. As such, it is often possible to achieve higher doping concentrations with carbon leading to a relatively lower sheet resistance and a better frequency performance than is generally possible with beryllium doping. Furthermore, owing largely to a lower diffusibility of carbon compared to beryllium, carbon doping may provide better $V_{BE}$ control as well as lower collector-emitter offset voltage ($V_{CE\ offset}$) than beryllium doping when the doped III-V semiconductor is used as a base-layer of a transistor (e.g., an HBT). However, carbon as a dopant has a relatively large carrier (i.e., hole) effective mass that may limit carrier (i.e., hole) mobility. Furthermore, a potential exists for hydrogen passivation of carbon atoms when using carbon as a p-type dopant, especially when employing gas source molecular beam epitaxy (GSMBE) to grow and deposit relatively thin layers of the carbon-doped III-V semiconductor.

BRIEF SUMMARY

In some examples, a combinationally doped semiconductor layer is provided. The combinationally doped semiconductor layer comprises a first sublayer of a semiconductor material doped substantially with beryllium. The combinationally doped semiconductor layer further comprises a second sublayer of the semiconductor material doped substantially with carbon. The carbon-doped second sublayer is disposed on the beryllium-doped first sublayer. The semiconductor material of the first and second sublayers comprise a III-V compound semiconductor, according to some examples.

In some examples, double heterojunction bipolar transistor (DHBT) is provided. The DHBT comprises a base layer of a semiconductor material doped with a combination of carbon and beryllium. According to some examples, a first sublayer of the base layer is doped substantially with beryllium and a second sublayer is doped substantially with carbon. The DHBT further comprises a collector layer adjacent to a first side of the base layer and an emitter layer adjacent to a second side of the base layer opposite to the first side. The second sublayer of the base layer is adjacent to the emitter layer, according to some examples.

In some examples, a method of making a combinationally doped semiconductor layer is provided. The method of making a combinationally doped semiconductor layer comprises growing a first sublayer of the combinationally doped semiconductor layer. The first sublayer is doped substantially with beryllium. The method of making a combinationally doped semiconductor layer further comprises growing a second sublayer of the combinationally doped semiconductor layer. The second sublayer is doped substantially with carbon and is grown disposed on the beryllium-doped first sublayer. A semiconductor material of the first semiconductor sublayer and the second semiconductor sublayer comprise a III-V compound semiconductor, according to some examples.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Figure 1:
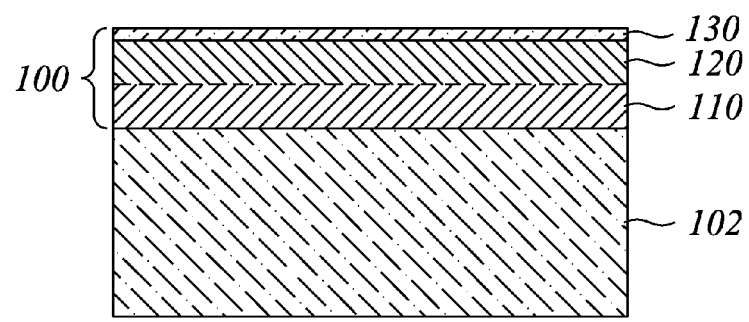
FIG. 1 illustrates a cross-sectional view of a combinationally doped semiconductor layer, according to an example of the principles described herein.

Certain examples have other features that are one of in addition to and in lieu of the features illustrated in the above-referenced figures. These and other features are detailed below with reference to the preceding drawings.

DETAILED DESCRIPTION

Examples in accordance with the principles described herein provide a III-V semiconductor layer doped with a combination of carbon and beryllium. In particular, examples herein provide a combinationally doped III-V semiconductor layer generally comprising a pair of sublayers. A first sublayer of the pair is substantially doped with beryllium while a second sublayer is substantially doped with carbon. Together the beryllium-doped and carbon-doped sublayers function to provide a III-V semiconductor layer that overcomes many of the difficulties experienced when doping with either beryllium or carbon alone. According to various examples of the principles described herein, the combinationally doped semiconductor layer has a variety of applications including, but not limited to, serving as a p-type base layer of a heterojunction bipolar transistor (HBT), for example.

Table 1 provides a comparison of various characteristics of a combinationally doped semiconductor layer and semiconductor layers doped solely with either beryllium or carbon. As detailed in Table 1, a sheet resistance of the combinationally doped semiconductor layer may be comparable to a carbon-only doped semiconductor layer, as exemplified by a base layer resistance $R_{base}$ in an NPN transistor, for example. Moreover, carrier concentrations of both of the combinationally doped and the carbon-only doped semiconductor layers may be relatively higher than a semiconductor layer doped only with beryllium. On the other hand, the combinationally doped semiconductor layer exhibits a carrier (i.e., hole) mobility GO that may be comparable to the beryllium-only doped semiconductor layer while being relatively higher than that of the carbon-only doped semiconductor layer, for example. Further, a base-emitter turn-on voltage ($V_{BE}$) of an NPN transistor using the beryllium-only doped semiconductor may be relatively high due to diffusion, especially if the base layer sheet resistance (e.g., $R_{Base}$) is less than about 650 ohms per square (Ω/sq), for example. Furthermore, overall performance, especially frequency performance in terms of one or both of a current gain cutoff frequency $F_t$ and a maximum frequency of oscillation $F_{max}$, may be relatively higher with the combinationally doped semiconductor than with either carbon-only or beryllium-only doping, for example. As such, the combinationally doped semiconductor layer may outperform both the carbon-only and beryllium only semiconductor layers, according to some examples.

TABLE 1

Comparison Characteristics of Combinationally Doped and Conventionally Doped Semiconductor Layers

|  | Conventional C-Doped Only | Conventional Be-Doped Only | Combinational Doping |
|---|---|---|---|
| $R_{Base}$ | Low (~600 Ω/sq) | High (800 Ω/sq) | Low (~600 Ω/sq) |
| Current Gain (β) | Less than 40 | ~150 | ~100 |
| Carrier Concentration | High | Low | High |
| Hole Mobility | 40 cm²/V.s | 70 cm²/V.s | 70 cm²/V.s |
| Graded Base | 0.75 to 0.85 eV | 0.75 to 0.85 eV | 0.75 to 0.85 eV |
| $V_{BE}$ turn on | Low (controllable) | High (*) | Low |
| Performance | Poor due to low gain | Poor due to high $V_{be}$ | Excellent due to high gain and low $V_{be}$ |
| $F_t$ and $F_{max}$ | Low | Low | High |
| Thickness | Constant | Constant | Constant |

(*) due to beryllium diffusion.

Herein, a 'p-type material' or equivalently a 'p-type semiconductor' is defined as a semiconductor that is doped with a p-type dopant. A p-type dopant or doping agent is defined as any material that, when present in trace amounts within a lattice of a semiconductor (e.g., substituted into a lattice of the semiconductor), acts as an acceptor material to effectively increase a number or concentration of positive ('p') free carriers within the semiconductor. Positive free carriers are often referred to as 'holes' indicating an absence of an electron. For example, trivalent atoms (e.g., from group IIIA of the periodic table) such as boron (B) and aluminum (Al) are known as p-type dopants for type IV semiconductors such as, but not limited to, silicon (Si) and germanium (Ge). Atoms of elements from group II and group IV may act as acceptors and thus serve as a p-type dopant for III-V semiconductors. For example, beryllium (Be), zinc (Zn), magnesium (Mg) and carbon (C) may be used to provide p-type doping to produce p-type gallium arsenide (GaAs), p-type aluminum gallium arsenide (AlGaAs), p-type indium gallium arsenide (InGaAs), and p-type gallium nitride (GaN).

Moreover, an 'n-type material' or equivalently an 'n-type semiconductor' is defined as a semiconductor that is doped with an n-type dopant. An n-type dopant is defined as any material that, when present in trace amounts within a lattice of a semiconductor, acts as a donor material to effectively increase a number or concentration of negative ('n') free carriers (i.e., electrons) within the semiconductor. For example, phosphorous (P), arsenic (As) and antimony (Sb), atoms from group V of the periodic table, are known n-type dopants for group IV semiconductors such as silicon (Si) and germanium (Ge). Group VI as well as group IV elements (e.g., sulfur (S), selenium (Se), tellurium (Te), silicon (Si), and germanium (Ge)) may be used as n-type dopants for various III-V semiconductors, for example. A substantially undoped semiconductor or a semiconductor that is an unintentionally doped semiconductor (e.g., as a result of a manufacturing process) is referred to as an intrinsic semiconductor. As such, an intrinsic semiconductor may be defined as a substantially pure semiconductor in which no dopant species is present in any significant amount.

A semiconductor that is doped with either a p-type dopant or an n-type dopant is referred to as an extrinsic semiconductor. A heavily doped extrinsic semiconductor may be denoted using a '+' (e.g., n⁺ or p⁺) while a lightly doped extrinsic semiconductor may be denoted using a '−' (e.g., n⁻ or p⁻). By way of example herein, a heavily doped semiconductor (i.e., n⁺-type or p⁺-type) is a semiconductor having a doping or a dopant concentration of greater than about $1 \times 10^{17}$ cm⁻³ and typically greater than about $1 \times 10^{18}$ cm⁻³. For example, a p-type III-V semiconductor with a p-type dopant concentration of $1 \times 10^{18}$ cm⁻³ may be denoted as having a p⁺ doping and further referred to as a p⁺-type semiconductor. Dopant concentrations of less than about $1 \times 10^{17}$ cm⁻³ and typically less than about $1 \times 10^{16}$ cm⁻³ are characterized as moderately doped (e.g., n-type or p-type). Dopant concentrations much below about $1 \times 10^{15}$ cm⁻³ and typically below about $1 \times 10^{13}$ cm⁻³ are referred to as lightly doped semiconductors herein (e.g., n⁻-type or p⁻-type). Intrinsic semiconductors may have dopant concentrations well below $1 \times 10^{10}$ cm⁻³, for example.

Herein, no distinction is made between a substrate and a substrate having a layer or layers on a surface of the substrate unless such distinction is necessary for proper understanding. Further as used herein, the article 'a' is intended to have its ordinary meaning in the patent arts, namely 'one or more'. For example, 'a layer' means one or more layers and as such, 'the layer' means 'the layer(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means that the value is within normal tolerances of a measurement technique used, or in some examples, plus or minus 10%, unless otherwise expressly specified. Moreover, examples herein are intended to be illustrative only and are presented for discussion purposes and not by way of limitation.

FIG. 1 illustrates a cross-sectional view of a combinationally doped semiconductor layer 100, according to an example of the principles described herein. The combinationally doped semiconductor layer 100 may be a layer on and generally supported by a substrate 102, as illustrated for example. According to some examples, the substrate 102 that supports the combinationally doped semiconductor layer 100 may comprise a semi-insulating material (e.g., an intrinsic semiconductor). In another example, the substrate 102 comprises an extrinsic semiconductor. For example, the combinationally doped semiconductor layer 100 may be a layer on top of another semiconductor layer (not illustrated) that is, in turn, supported by the substrate 102. The other semiconductor layer may comprise a doped semiconductor (i.e., be an extrinsic semiconductor), for example. The other semiconductor layer comprising the doped semiconductor may be a layer of a device (e.g., a transistor), for example. As such, the substrate 102 may be considered to comprise the other semiconductor layer such that the substrate 102 comprises an extrinsic semiconductor.

The combinationally doped semiconductor layer 100 comprises a first sublayer 110 of a semiconductor material doped substantially with beryllium (Be). By 'doped substantially with beryllium' it is meant, by definition herein, that a principal dopant of or within at least a portion of the semiconductor material of the first sublayer 110 is beryllium. For example, beryllium may be the only dopant present in any significant quantity or concentration within the entire first sublayer 110. In another example, a total concentration of beryllium as a dopant within the first sublayer 110 at least exceeds a total concentration of any other material that acts as a dopant of the semiconductor material of the first sublayer 110. In yet another example, a concentration of beryllium exceeds a concentration of any another dopant within at least a portion of the first sublayer 110. The portion of the first sublayer 110 may be at or adjacent to a bottom of the combinationally doped semiconductor layer 100 next to the substrate 102, as illustrated for example.

The combinationally doped semiconductor layer 100 further comprises a second sublayer 120 of a semiconductor material doped substantially with carbon (C). By definition herein, 'doped substantially with carbon' means that a principal dopant of or within at least a portion of the semiconductor material of the second sublayer 120 is carbon. For example, carbon may be the only dopant present in any significant quantity or concentration within the entire second sublayer 120. In another example, a total concentration of carbon as a dopant within the second sublayer 120 at least exceeds a total concentration of any other material that acts or may act as a dopant of the semiconductor material of the second sublayer 120. In yet another example, a concentration of carbon exceeds a concentration of any another dopant within at least a portion of the second sublayer 120. The portion of the second sublayer 120 may be at or adjacent to a top of the combinationally doped semiconductor layer 100 away from the substrate 102, as illustrated for example.

The carbon-doped second sublayer 120 of the combinationally doped semiconductor layer 100 is disposed on and is in substantial contact with the beryllium-doped first sublayer 110, according to some examples. In other examples (not illustrated), the beryllium-doped first sublayer 110 is in substantial contact with and overlies or is disposed on the carbon-doped sublayer 120. In some examples, the semiconductor material of the first sublayer 110 is substantially the same as the semiconductor material of the second sublayer 120, but for the differences in the dopants. In particular, the semiconductor of both the first and second sublayers 110, 120 may comprise a III-V compound semiconductor, according to some examples. Further, a lattice of the III-V compound semiconductor may be substantially continuous throughout the combinationally doped semiconductor layer 100.

In some examples, the III-V compound semiconductor of both the first and second sublayers 110, 120 comprises indium gallium arsenide (InGaAs). For example, the III-V compound semiconductor may comprise $In_{0.56}Ga_{0.44}As$. In other examples, another III-V compound semiconductor may be used including, but not limited to, gallium arsenide (GaAs), gallium nitride (GaN), aluminum gallium nitride (AlGaN), aluminum gallium arsenide (AlGaAs), indium gallium phosphide (InGaP), indium gallium antimonide (InGaSb), aluminum indium arsenide (AlInAs), indium gallium nitride (InGaN), gallium arsenide antimonide (GaAsSb), aluminum arsenide antimonide (AlAsSb), gallium antimonide phosphide (GaSbP), and aluminum antimonide phosphide (AlSbP).

In some examples, a concentration profile of dopants in the combinationally doped semiconductor layer 100 is graded. In particular, concentrations of beryllium and carbon in the respective first and second sublayers 110, 120 are graded. The concentrations may be graded monotonically, for example, as a function of distance through the combinationally doped semiconductor layer 100. For example, a concentration of beryllium may be highest at a side of first sublayer 110 away from the second sublayer 120. Further, a concentration of carbon may be highest at a side of second sublayer 120 away from the first sublayer 110, for example. In other examples, the grading may be non-monotonic with a peak concentration of one or both of the beryllium and carbon occurring at a point other than near an edge, border or boundary of the combinationally doped semiconductor layer 100. In yet other examples, the concentration profile may be substantially abrupt (i.e., not intentionally graded). An abrupt concentration profile is indicative of an example where beryllium is the only dopant of significance within the first sublayer 110 while carbon is the only dopant of significance within the second sublayer 120. In some examples, the concentration of beryllium and the concentration of carbon are about equal at an interface between the first and second sublayers 110, 120.

Figure 2A:
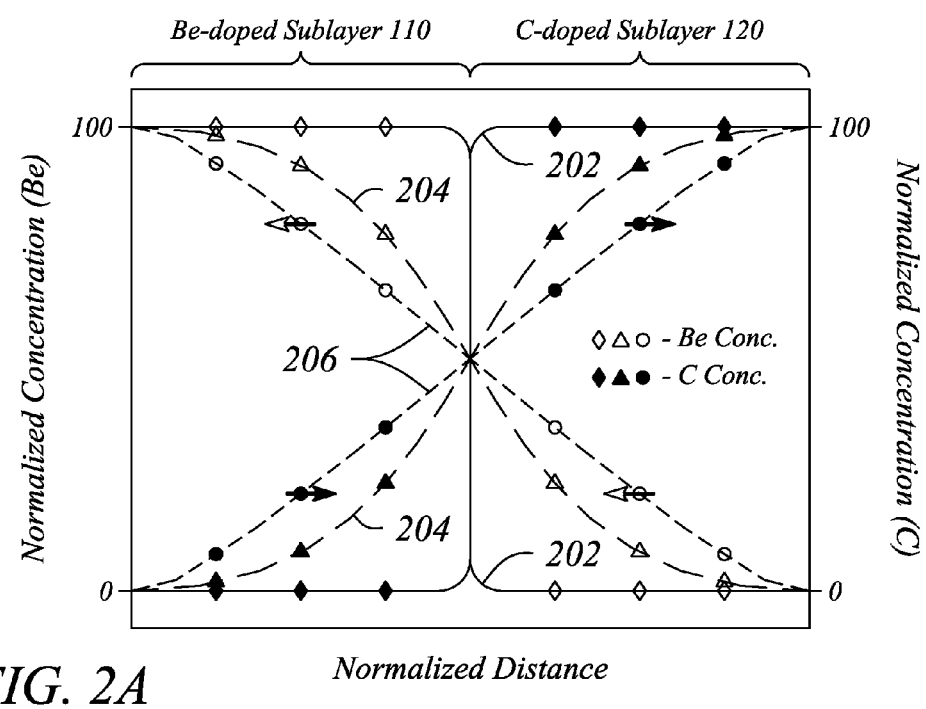
FIG. 2A illustrates a graph of example doping profiles of a combinationally doped semiconductor layer, according to an example of principles described herein.

FIG. 2A illustrates a graph of example doping profiles of a combinationally doped semiconductor layer 100, according to an example of principles described herein. In particular, a normalized doping profile of beryllium concentration (i.e., left vertical axis) and carbon concentration (i.e., right vertical axis) are plotted as a function of distance through the combinationally doped semiconductor layer 100. A first pair of curves 202 (filled and unfilled diamond shapes) illustrates a relatively abrupt concentration profile in terms of respective normalized concentrations of beryllium and carbon. A second pair of curves 204 (filled and unfilled triangle shapes) illustrates a graded concentration profile in terms of respective normalized concentrations of beryllium and carbon. A third pair of curves 206 (filled and unfilled circle shapes) illustrates another graded concentration profile in terms of normalized concentrations of beryllium and carbon, respectively. An example extent or thickness in terms of a normalized thickness of each of the first sublayer 110 and the second sublayer 120 is also illustrated in FIG. 2A using labeled brackets.

According to some examples, a concentration of the dopants in the combinationally doped semiconductor layer 100 is relatively high (e.g., p+). In some examples, a doping concentration of beryllium in the first sublayer 110 is greater than about $1.0\times10^{19}$ cm$^{-3}$. For example, the doping concentration of beryllium within the first sublayer 110 may be about $4.0\times10^{19}$ cm$^{-3}$. In some examples, a doping concentration of carbon in the second sublayer 120 is greater than about $1.0\times10^{20}$ cm$^{-3}$. For example, the doping concentration of carbon within the second sublayer 120 may be about $2.0\times10^{20}$ cm$^{-3}$. In another example, the doping concentration of carbon within the second sublayer 120 may be about $8.0\times10^{19}$ cm$^{-3}$.

Figure 2B:
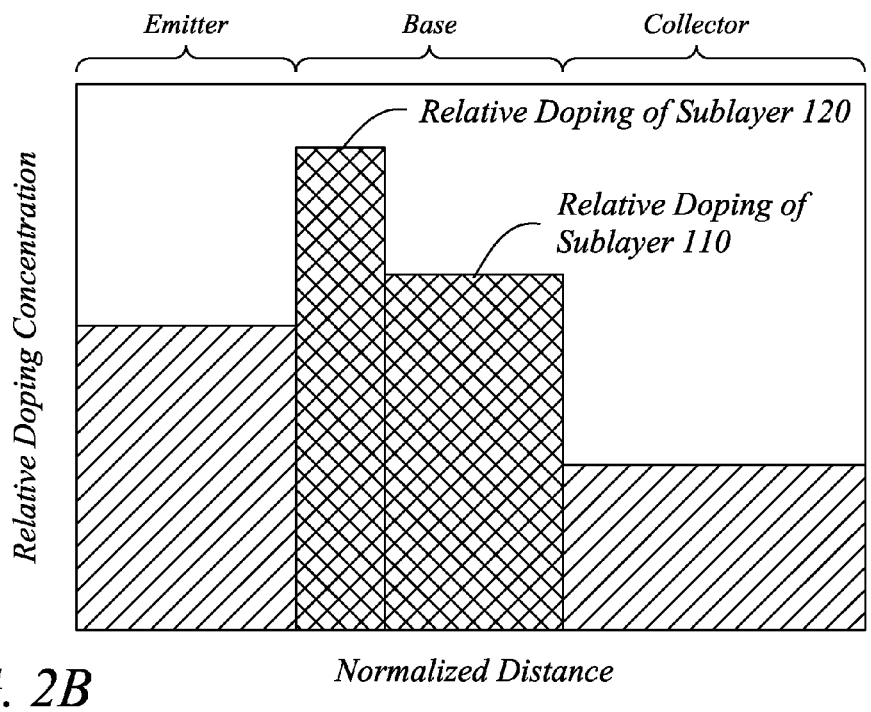
FIG. 2B illustrates a bar graph of example relative doping concentrations of a combinationally doped semiconductor layer, according to an example of principles described herein.

FIG. 2B illustrates a bar graph of relative doping concentrations of a combinationally doped semiconductor layer, according to an example of principles described herein. In particular, FIG. 2B illustrates example relative doping concentrations in the first sublayer 110 and the second sublayer 120. Also illustrated are relative doping concentrations in layers that may be adjacent to the first and second sublayers 110, 120. Adjacent layers may include a collector layer (i.e., collector) and an emitter layer (i.e., emitter) when the first and second sublayers 110, 120 are a base layer (i.e., base) of a heterojunction bipolar transistor (HBT), for example.

According to some examples, an overall thickness of the combinationally doped semiconductor layer 100 is relatively thin. For example, the overall thickness may be less than about 400 angstroms (Å). In some examples, the first sublayer 110 may have a thickness of between about 250 Å and about 275 Å. The thickness of the second sublayer 120 may be between about 75 Å and about 100 Å, in some examples. As such, the overall thickness of the combinationally doped semiconductor layer 100 may be between about 325 Å and about 375 Å, for example. In some examples, the thickness of the second sublayer 120 may be less than 75 Å. For example, the thickness of the second sublayer 120 may be as thin as about 50 Å or even about 25 Å, or a value in between these numbers. When a total thickness of layer 100 is kept constant, reducing the thickness of the second sublayer 120 relative to the thickness of the first sublayer 110 may decrease a sheet resistance $R_s$ of the combinationally doped semiconductor layer 100, for example. Reducing the relative thickness of the second sublayer 120 may also increase a direct current (DC) gain of a transistor that uses the combinationally doped semiconductor 100 as a base layer, for example.

Referring back to FIG. 1, in some examples, the combinationally doped semiconductor layer 100 further comprises a cap or capping layer 130. In some examples, the capping layer 130 may be disposed on a top surface of the combinationally doped semiconductor layer 100 adjacent to an upper boundary of the second sublayer 120, as illustrated. In other examples, for example when the second sublayer 120 is adjacent to an underlying support structure (e.g., the substrate 102), the capping layer 130 may be on a top surface of the combinationally doped semiconductor layer 100 adjacent to an upper boundary of first sublayer 110 (not illustrated). The capping layer 130 may protect the combinationally doped semiconductor layer 100 from degradation during processing subsequent to providing the capping layer 130, for example. For example, the capping layer 130 may protect the combinationally doped semiconductor layer 100 during deposition of an overlying layer on top of the combinationally doped semiconductor layer 100 (not illustrated). The capping layer 130 may reduce, or in some examples, substantially minimize, one or both of carbon passivation and possible in-diffusion of hydrogen atoms, according to some examples.

In some examples, the capping layer 130 comprises a relatively thin layer deposited at a temperature consistent with processing temperatures of the combinationally doped semiconductor layer 100. In some examples, the capping layer 130 may be a layer having a thickness of between about 5 and about 50 Å. For example, the capping layer 130 may be about 20 Å. In some examples, the capping layer 130 may comprise a semiconductor material that differs from the semiconductor material of the combinationally doped semiconductor layer 100. In some examples, the capping layer 130 may be an intrinsic semiconductor material. In some examples, the capping layer 130 comprises a material of a layer that overlies the capping layer 130.

According to various examples, the capping layer is grown at a temperature that is substantially similar to or below a temperature used to grow one or both of the sublayers 110, 120. Using the substantially similar temperature may protect the sublayers 110, 120, for example.

In some examples, the capping layer 130 may comprise a layer of low temperature indium phosphide (InP). By definition herein, low temperature InP is an InP layer deposited at a temperature below a normal deposition temperature used to deposit InP. The InP may be deposited without the presence of a dopant, for example. In some examples, low temperature InP may be InP deposited at a temperature about equal to a temperature used to deposit the combinationally doped semiconductor layer 100. For example, InP may be conventionally deposited at about 470 degrees Celsius (° C.), while the beryllium-doped first sublayer 110 may be deposited at a temperature between about 450° C. and about 455° C. In other examples, a growth temperature of an InP bulk layer may be generally in the range from about 450° C. to 490° C., as long as InP material of sufficient quality is obtained. Similarly, the low temperature InP capping layer 130 may be InP deposited at a temperature between about 450° C. and about 455° C. instead of the conventional 470° C. The temperatures for Molecular Beam Epitaxy (MBE) herein are consistent with using a MOD GEN II MBE system manufactured by Veeco Instruments, Inc. (www.veeco.com), Plainview, N.Y., for layer growth.

In some examples, the combinationally doped semiconductor layer 100 is a base layer of a heterojunction bipolar transistor (HBT) that includes an emitter layer. In some examples, the emitter layer of the HBT comprises indium phosphide (InP) and the base layer (i.e., a III-V compound semiconductor of the combinationally doped semiconductor layer 100) comprises InGaAs. In some examples, the HBT further comprises a low temperature InP capping layer between the InP emitter layer and the combinationally doped InGaAs semiconductor base layer 100. In some examples, the HBT is a double heterojunction bipolar transistor (DHBT). Aspects of DHBTs are discussed in more detail in U.S. Pat. Nos. 7,494,887, 7,576,409, 7,655,529, 7,531,851, each of which is incorporated by reference herein in its entirety.

Figure 3:
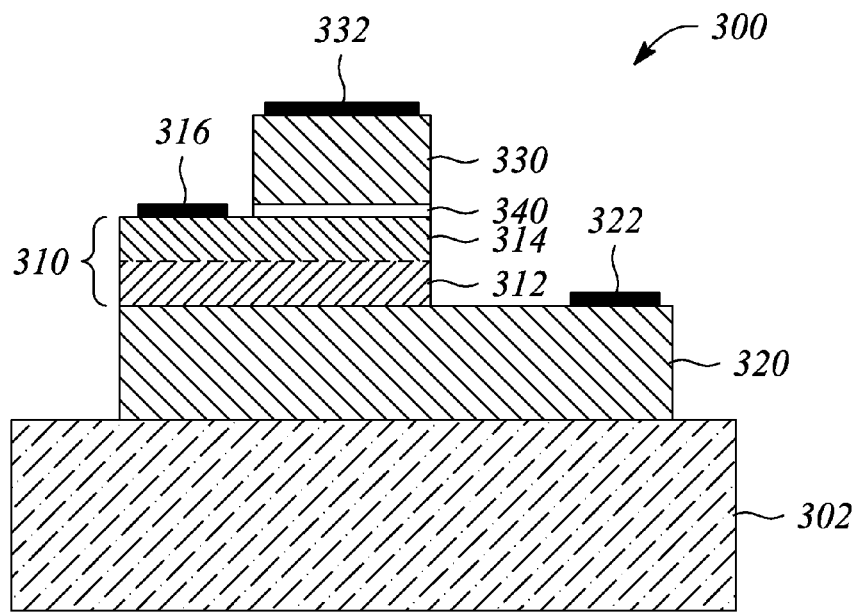
FIG. 3 illustrates a cross-sectional view of a double heterojunction bipolar transistor (DHBT), according to an example of the principles described herein.

FIG. 3 illustrates a cross-sectional view of a double heterojunction bipolar transistor (DHBT) 300, according to an example of the principles described herein. The DHBT 300 may be an InP/Ga$_x$In$_{1-x}$As/InP (e.g., InP/Ga$_{0.53}$In$_{0.44}$As/InP) DHBT, for example. As illustrated, the DHBT 300 is supported by a substrate 302 that may be semi-insulating by way of example and not limitation. Further, the DHBT 300 is an 'emitter up' configuration having an emitter at a top and a collector at a bottom of a stack of layers, as illustrated. The DHBT 300 may also be realized as a 'collector up' configuration without departing from the scope herein. The DHBT 300 in FIG. 3 is an NPN DHBT, by way of example.

The DHBT 300 comprises a base layer 310 of a semiconductor material doped with a combination of carbon and beryllium. According to some examples, the base layer 310 is substantially similar to the combinationally doped semiconductor layer 100, described above. In particular, the base layer 310 comprises a first sublayer 312 and a second sublayer 314. The first sublayer 312 is doped with beryllium and the second sublayer 314 is doped with carbon. In some examples, the first sublayer 312 is doped substantially with beryllium. In some examples, the second sublayer 314 is doped substantially with carbon. In some examples, the base layer comprises a III-V compound semiconductor. In some examples, the III-V compound semiconductor comprises indium gallium arsenide (InGaAs). In another example, the III-V compound semiconductor comprises indium gallium antimonide (InGaSb) or another of the III-V compound semiconductors including, but not limited to, the III-V compound semiconductors listed above with respect to the combinationally doped semiconductor layer 100.

The DHBT 300 further comprises a collector layer 320 adjacent to and below the base layer 310, as illustrated. The collector layer 320 comprises a III-V compound semiconductor doped with an n-type dopant. In some examples, the III-V compound semiconductor of the collector layer 320 may be graded. In some examples, the III-V compound semiconductor of the collector layer 320 may comprise InP (e.g., when the base layer 310 comprises InGaAs). In another example, the collector layer 320 comprises InGaAs. In yet another example, the collector layer 320 comprises GaAs (e.g., when the base layer 310 comprises one of GaAsSb and $In_xGa_{1-x}As$, where x<0.20). In some examples, the collector layer 320 further comprises a quarternary layer (not illustrated) at a top portion of the collector layer 320 between the base layer 310 and a main portion of the collector layer 320. The quarternary layer may comprise InGaAsP and may be graded, for example.

The DHBT further comprises an emitter layer 330 disposed on the base layer 310. The emitter layer 330 comprises a III-V compound semiconductor doped with an n-type dopant. In some examples, the emitter layer 330 comprises n-type InP. For example, n-type InP may be used when the III-V compound semiconductor of the base layer 310 is AlGaAs. In another example, the III-V compound semiconductor of the emitter layer 330 may comprise GaAs (e.g., when the base layer 310 comprises AlGaAs). In some examples (not illustrated), the emitter layer 330 may further comprise an $n^+$-doped portion to facilitate contact to the emitter layer 330.

In some examples, the DHBT further comprises an emitter capping layer 340. The emitter capping layer 340 is located between the base layer 310 and the emitter layer 330. In some examples, the emitter capping layer 340 comprises a semiconductor material of the emitter layer 330. For example, when the emitter layer 330 comprises InP, the emitter capping layer 340 may comprise InP. In some examples, the emitter capping layer 340 is relatively thin compared to a thickness of the base layer 310. In some examples, the emitter capping layer 340 may have a thickness between about 5 Å and about 50 Å. For example, the emitter capping layer 340 may be about 20 Å thick. In some examples, the emitter capping layer 340 comprises low temperature InP. In some examples, the emitter capping layer 340 is substantially the same as capping layer 130 described above.

In the example illustrated in FIG. 3, the DHBT 300 further comprises a base contact 316 connected to the base layer 310. The DHBT 300 may further comprise a collector contact 322 connected to the collector layer 320. The DHBT 300 may further comprise an emitter contact 332 connected to the emitter layer 330. The contacts 316, 322 and 332 each may be made from a material selected from a metal and a heavily doped semiconductor.

Figure 4:
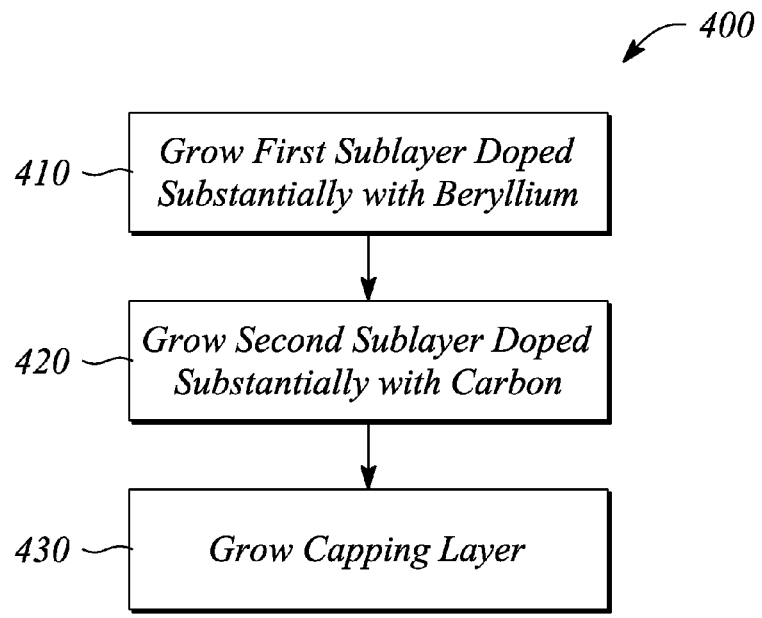
FIG. 4 illustrates a flow chart of a method of making a combinationally doped semiconductor layer, according to an example of the principles described herein.

FIG. 4 illustrates a flow chart of a method 400 of making a combinationally doped semiconductor layer, according to an example of the principles described herein. As illustrated in FIG. 4, the method 400 of making a combinationally doped semiconductor layer comprises growing 410 a first sublayer of the semiconductor layer. Growing 410 may be performed on a substrate, for example. In another example, growing 410 may be performed on a semiconductor layer (doped or undoped) on the substrate.

The grown 410 first sublayer is doped substantially with beryllium, according to some examples. In some examples, doping with beryllium is provided as the first sublayer is grown 410. The first sublayer may be grown 410 using molecular beam epitaxy (MBE), for example. For example, gas source MBE (GSMBE) may be employed. Other methods including, but not limited to, metal-organic molecular beam epitaxy (MOMBE) and chemical beam epitaxy (CBE), may be used as an alternative to GSMBE for growing 410 the first sublayer, according to some examples. A source of beryllium is provided to introduce Be into the first sublayer during growing 410 as an p-type dopant for the first sublayer, for example. A concentration of the beryllium source may be modulated during growth 410 to modulate the amount of Be doping, in some examples. Growing 410 may yield a first sublayer of the semiconductor layer that is substantially similar to the first sublayer 110 described above with respect to the combinationally doped semiconductor layer 100, according to some examples.

The method 400 of making a combinationally doped semiconductor layer further comprises growing 420 a second sublayer of the semiconductor layer. The grown 420 second sublayer is doped substantially with carbon. In some examples, doping with carbon is provided as the second sublayer is grown 420. The carbon-doped second semiconductor sublayer is grown 420 disposed on top of and in substantial contact with the beryllium-doped first sublayer. The second sublayer may be grown 420 using MBE such as GSMBE, for example. Other methods including, but not limited to, MOMBE and CBE, may be used as an alternative to GSMBE for growing 420 the second sublayer, for example. A source of carbon (e.g., $CBr_4$) may be introduced during growing 420 to provide carbon doping of the second sublayer, for example. A concentration of the carbon source may be modulated during growth 420 to modulate the amount of carbon doping, in some examples. Growing 420 may yield a second sublayer of the semiconductor layer that is substantially similar to the second sublayer 120 described above with respect to the combinationally doped semiconductor layer 100, according to some examples. In some examples, the semiconductor of both the first and second sublayers comprises a III-V compound semiconductor. For example, the III-V compound semiconductor may comprise InGaAs.

In some examples, growing 410 the first sublayer comprises depositing the III-V semiconductor along with the beryllium dopant at a first temperature. Growing 420 the second sublayer then follows growing 410 the first sublayer and comprises depositing the III-V semiconductor along with the carbon dopant at a second temperature. The second temperature may be lower than the first temperature, according to various examples. For example, the first temperature may be between about 450° C. and about 455° C. while the second temperature may be between about 425° C. and about 435° C. Depositing at the first temperature and the second temperature may be accomplished using GSMBE, as mentioned above, for example.

In some examples, the method 400 of making a combinationally doped semiconductor layer further comprises growing 430 a capping layer on a surface of the second sublayer. The capping layer may be substantially similar to the capping layer 130 and the emitter capping layer 340 described above regarding the combinationally doped semiconductor layer 100 and DHBT 300, respectively. In particular, the capping layer may comprise InP, for example. In some examples, the capping layer is grown 430 at a temperature substantially similar to the first temperature used to grow 410 the first sublayer. When an InP capping layer is grown 430 at the first temperature on combinationally doped semiconductor layer comprising AlGaAs, the InP capping layer comprises low temperature InP, for example.

Figure 5:
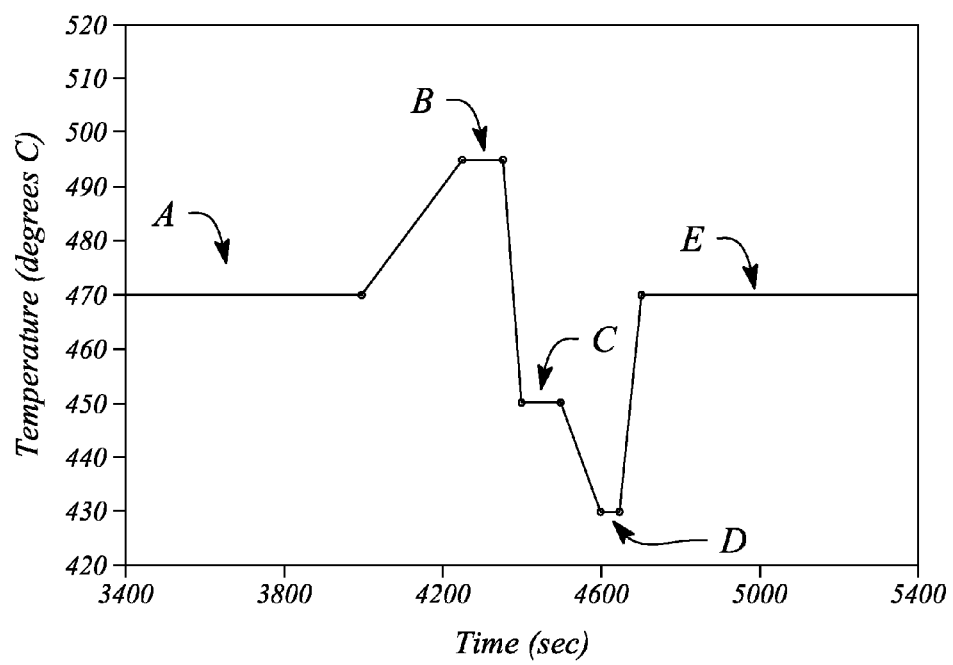
FIG. 5 illustrates a graph of an example temperature profile used in the method of making a combinationally doped semiconductor layer of FIG. 4, according to another example of the principles described herein.

FIG. 5 illustrates a graph of an example temperature profile used in the method 400 of making a combinationally doped semiconductor layer, according to an example of the principles described herein. In particular, the graph illustrates the temperature profile of an example InP/InGaAs/InP double heterojunction bipolar transistor (DHBT) where the temperature profile of the combinationally doped semiconductor layer is a portion thereof (e.g., base layer temperature profile portions at e.g., time periods C and D, described below).

As illustrated in FIG. 5, a collector layer of InP of the DHBT is deposited at a temperature of about 470° C. for a first time period A. During a second time period B, the temperature is raised to about 495° C. and a quarternary layer is deposited. The beryllium-doped first sublayer of the DHBT base layer is grown 410 by depositing InGaAs along with beryllium at a temperature of about 450° C. The first sublayer is grown 410 for a third time period C. The temperature is then lowered to about 430° C. and the carbon-doped second sublayer of the DHBT base layer is grown 420 by depositing InGaAs along with carbon at about 430° C. The second sublayer is grown 420 for a fourth time period D. After the second sublayer is grown 420, the temperature is raised back to the temperature appropriate for depositing InP (i.e., about 470° C.) and an emitter layer comprising InP is formed during a fifth time period E. The time periods A-E have lengths consistent with depositing and growing respective layers given a particular growth technique, layer thickness and conditions (e.g., GSMBE). As illustrated, the time period A begins at 3400 seconds to account for a warm-up period for GSMBE, for example.

Figure 6:
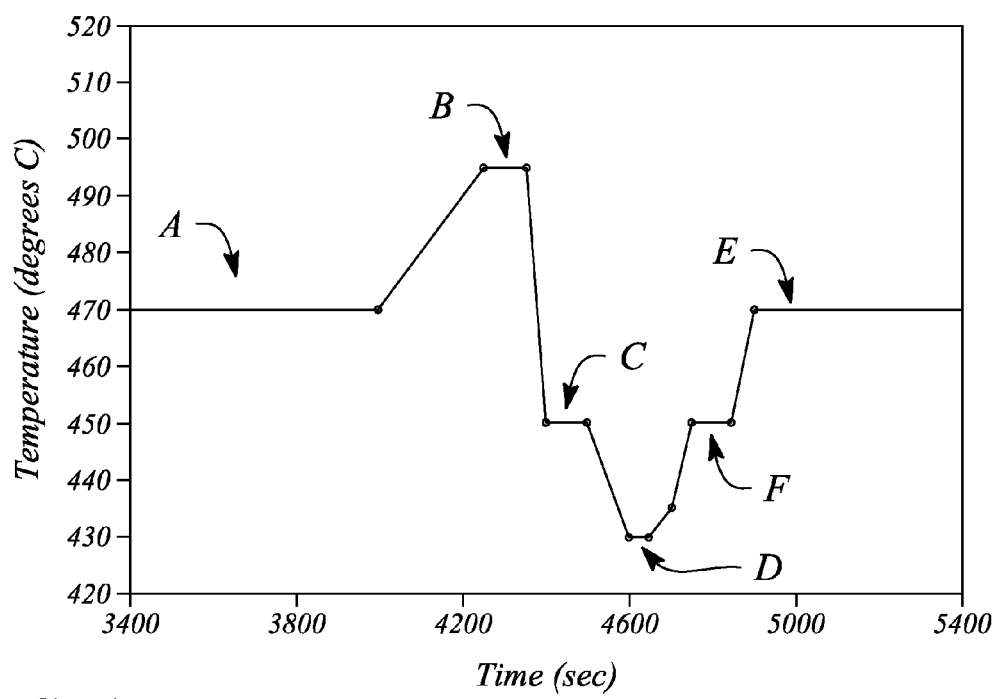
FIG. 6 illustrates a graph of an example temperature profile used in the method of making a combinationally doped semiconductor layer of FIG. 4, according to an example of the principles described herein.

FIG. 6 illustrates a graph of an example temperature profile for the method 400 of making a combinationally doped semiconductor layer, according to another example of the principles described herein. In particular, the graph illustrates the temperature profile of another DHBT where the temperature profile of the base layer (i.e., the combinationally doped semiconductor layer) is represented by time periods C, D and F. The temperature profile is substantially similar to the temperature profile illustrated in FIG. 5, except that the temperature profile of FIG. 6 includes growing 430 a capping layer as an emitter capping layer.

In particular, as illustrated in FIG. 6, the capping layer (i.e., emitter capping layer) is grown 430 during a sixth time period F. The sixth time period F is inserted in between growing 420 the second sublayer during time period D and depositing the emitter layer during time period E. As illustrated in FIG. 6, the temperature during the sixth time period F is raised from the about 430° C. temperature to about 450° C. and the emitter capping layer is grown 430 by depositing InP on the surface of the second sublayer. The emitter capping layer, having been grown 430 during the time period F at a temperature equivalent to the temperature of time period C (i.e., about 450° C.) represents low temperature InP, for example. In particular, the temperature at time period C is much less than the temperature used to deposit the InP emitter layer (i.e., about 470° C.) during the time period E, for example. The time periods A-E and F have lengths consistent with depositing and growing respective layers given a particular growth technique, layer thickness and conditions (e.g., GSMBE). As illustrated, the time period A begins at 3400 seconds to account for a warm-up period for GSMBE, for example.

In each of the following examples, molecular beam epitaxy (MBE) employed a Modified Intevac Gen-II MBE system (MOD GEN-II) manufactured by Veeco Instruments, Inc. (www.veeco.com), Plainview, N.Y. Further in the examples below, solid source were generally used for MBE deposition except for the use of arsine and phosphine.

EXAMPLES

Example I

Control

In a first control example, an InGaAs semiconductor layer doped solely with carbon (C) was grown using gas source molecular beam epitaxy (GSMBE). The carbon-doped InGaAs semiconductor layer following growth had an overall thickness of about 350 Å. Solid source carbon tetrabromide ($CBr_4$) was used for carbon doping. Concentrations of carbon were controlled by a pressure controller at a pressure of about 45 mTorr. An arsine flow rate was about 12 standard cubic centimeters per minute (sccm). Arsine flow rates of 12 sccm and 15 sccm were found to be consistent with producing hole concentrations of $1.1 \times 10^{20}$ $cm^{-3}$ and $8.7 \times 10^{19}$ $cm^{-3}$, respectively. The carbon-doped InGaAs was grown at a temperature of about 430° C. The InGaAs semiconductor layer was grown on an InP semi-insulating substrate having a thickness of about $6.0 \times 10^6$ Å.

Example II

Control

In a second control example, an InGaAs semiconductor layer doped solely with beryllium (Be) was grown using GSMBE. The beryllium-doped InGaAs semiconductor layer had an overall thickness of about 350 Å. Solid source Be material with five nines (0.99999) purity was employed for beryllium doping. A Be concentration was controlled using a Be cell temperature (i.e., a Knudsen cell) of about 935° C. The beryllium-doped InGaAs was grown at a temperature of about 455° C. The InGaAs semiconductor layer was grown on an InP semi-insulating substrate having a thickness of about $6.0 \times 10^6$ Å.

Example III

Combinationally Doped Semiconductor Layer

A combinationally doped semiconductor layer comprising InGaAs doped with both Be and C was grown using GSMBE. Growth of the beryllium-doped first sublayer was conducted at about 450° C. with doping being provided using the solid source Be as described above for example II. Growth of the first sublayer doped with beryllium produced a sublayer thickness of about 250 Å and yielded a beryllium dopant concentration of about $4.0 \times 10^{19}$ $cm^{-3}$ within the first sublayer. A carbon-doped second sublayer comprising InGaAs was then grown on top of the beryllium-doped first sublayer. Growth of the carbon-doped sublayer was conducted at about 430° C. using an arsine flow rate of about 12 sccm. Growth of the second sublayer doped with carbon produced a sublayer thickness of about 100 Å and yielded a carbon dopant concentration of about $8.0 \times 10^{19}$ $cm^3$ within the second sublayer.

An overall thickness of the combinationally doped semiconductor layer was about 350 Å. A 30 Å undoped InP capping layer was then grown on a top surface of the carbon-doped second sublayer at a temperature of about 450° C. (e.g., the temperature used for growing the Be-doped first sublayer). A flow rate of phosphine of about 5 sccm and a cracker temperature of about 750° C. was used while indium was provided by a solid source with an indium cell temperature of about 778° C. The combinationally doped InGaAs semiconductor layer was grown on an InP semi-insulating substrate having a thickness of about $6.0 \times 10^6$ Å.

Example IV

Combinationally Doped Semiconductor Layer

Another combinationally doped semiconductor layer comprising InGaAs doped with both Be and C was grown using GSMBE. Growth of the beryllium-doped first sublayer was conducted at about 450° C. using the same Be source and conditions described above in example III. Growth of the first sublayer doped with beryllium produced a sublayer thickness of about 275 Å and yielded a beryllium dopant concentration of about $4.0 \times 10^{19}$ cm$^{-3}$ within the first sublayer. A carbon-doped second sublayer comprising InGaAs was then grown on top of the beryllium-doped first sublayer. Growth of the carbon-doped sublayer was conducted at about 430° C. using an arsine flow rate of about 12 sccm and carbon-doping conditions described above. Growth of the second sublayer doped with carbon produced a sublayer thickness of about 75 Å and yielded a carbon dopant concentration of about $8.0 \times 10^{19}$ cm$^{-3}$ within the second sublayer. An overall thickness of the combinationally doped semiconductor layer was about 350 Å. A 30 Å undoped InP capping layer was then grown in a top surface of the carbon-doped second sublayer at a temperature of 450° C., as described above in example III. The combinationally doped InGaAs semiconductor layer was grown on an InP semi-insulating substrate having a thickness of about $6.0 \times 10^6$ Å.

Physical Properties of the Examples

Measurements of sheet resistance ($R_s$) using a transmission line method (TLM) were performed on the semiconducting layers from Examples I-IV. The sheet resistance results for both of the combinationally doped semiconductor layers (Examples III and IV) are substantially similar to the sheet resistance measured for the carbon-doped InGaAs semiconductor layer (Example I). A sheet resistance of the beryllium-doped InGaAs semiconductor layer (Example II) was measured to be much higher than either of the carbon-doped InGaAs semiconductor layer (Example I) and the two combinationally doped semiconductor layers (Examples III and IV). Results of the sheet resistance $R_s$ measurements are presented in Table 2.

Hall measurements employing a van der Pauw (VDP) method were performed on the semiconducting layers from Examples I-IV. Mobility GO results illustrated that the beryllium-doped semiconductor layer (Example II) and the combinationally doped semiconductor layers (Examples III and IV) were about the same. Mobility was much lower for the carbon-doped semiconductor layer (Example I). The VDP Hall measurement results are also provided in Table 2.

TABLE 2

TLM Sheet Resistance and VDP Hall Measurement Results

| | Layer Thickness | | | TLM | VDP Hall Measurement | |
|---|---|---|---|---|---|---|
| | Be-doped | C-doped | | | | |
| Ex. | Sublayer (Å) | Sublayer (Å) | Total (Å) | $R_s$ (Ω/sq) | p (cm$^{-3}$) | μ (cm$^2$/V · s) |
| I | 0 | 350 | 350 | 535.9 | 7.16E+19 | 48.22 |
| II | 350 | 0 | 350 | 880.2 | 4.26E+19 | 48.75 |
| III | 250 | 100 | 350 | 621.8 | 3.88E+19 | 51.44 |
| IV | 275 | 75 | 350 | 503.0 | 3.47E+19 | 57.47 |

Thus, there have been described examples of a combinationally doped semiconductor layer and a method of making a combinationally doped semiconductor layer that comprise doping the semiconductor layer with both carbon and beryllium and a device employing same. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A heterojunction bipolar transistor (HBT) having a base layer comprising:
   a first sublayer of a semiconductor material doped substantially with beryllium; and
   a second sublayer of the semiconductor material doped substantially with carbon, the carbon-doped second sublayer being disposed on the beryllium-doped first sublayer,
   wherein the semiconductor material of the first and second sublayers comprise a III-V compound semiconductor, the base layer being a combinationally doped semiconductor base layer.

2. The heterojunction bipolar transistor of claim 1, wherein the III-V compound semiconductor is indium gallium arsenide (InGaAs).

3. The heterojunction bipolar transistor of claim 1, wherein a concentration of beryllium in the first sublayer and a concentration of carbon in the second sublayer are independently graded, the concentration of beryllium being highest at a side of first sublayer away from the second sublayer, the concentration of carbon being highest at a side of the second sublayer away from the first sublayer.

4. The heterojunction bipolar transistor of claim 3, wherein the concentration of beryllium and the concentration of carbon are about equal at an interface between the first and second sublayers.

5. The heterojunction bipolar transistor of claim 1, wherein a dopant concentration of beryllium in the first sublayer is about $4.0 \times 10^{19}$ cm$^{-3}$ and a dopant concentration of carbon in the second sublayer is about $2 \times 10^{20}$ cm$^{-3}$ and wherein a thickness of the first sublayer is between about 250 angstroms (Å) and about 275 Å and a thickness of the second sublayer is between about 50 Å and about 100 Å.

6. The heterojunction bipolar transistor of claim 1, further comprising a capping layer on a surface of the combinationally doped semiconductor base layer, the capping layer having a thickness of between about 5 angstroms (Å) and about 50 Å.

7. The heterojunction bipolar transistor of claim 1, wherein an emitter layer of the HBT comprises indium phosphide (InP), and wherein the III-V semiconductor of the combinationally doped semiconductor base layer comprises InGaAs, the HBT further comprising a low temperature InP emitter capping layer between the InP emitter layer and the combinationally doped InGaAs semiconductor base layer.

8. A double heterojunction bipolar transistor comprising:
   a base layer of a semiconductor material doped with a combination of carbon and beryllium, a first sublayer of the base layer being doped substantially with beryllium and a second sublayer being doped substantially with carbon;
   a collector layer adjacent to a first side of the base layer; and
   an emitter layer adjacent to a second side of the base layer opposite to the first side,
   wherein the second sublayer of the base layer is adjacent to the emitter layer.

9. The double heterojunction bipolar transistor of claim 8, wherein the base layer comprises a compound semiconductor of indium gallium arsenide (InGaAs) and the emitter layer comprises n-type indium phosphide (InP).

10. The double heterojunction bipolar transistor of claim 9, wherein the collector layer comprises n-type InP.

11. The double heterojunction bipolar transistor of claim 8, further comprising an emitter capping layer between the emitter layer and the base layer.

12. The double heterojunction bipolar transistor of claim 11, wherein the emitter capping layer comprises a semiconductor material of the emitter layer and has a thickness between about 5 angstroms (Å) and about 50 Å.

13. The double heterojunction bipolar transistor of claim 8, further comprising an emitter capping layer between the emitter layer and the base layer, wherein the emitter layer and the collector layer each comprises indium phosphide (InP), the emitter capping layer comprising low temperature InP, the base layer comprising a compound semiconductor of indium gallium arsenide (InGaAs), and wherein a dopant concentration of beryllium in the first sublayer is about $4.0 \times 10^{19}$ cm$^{-3}$ and a dopant concentration of carbon in the second sublayer is about $2 \times 10^{20}$ cm$^3$.

14. A method of making a combinationally doped semiconductor layer, the method comprising:
   growing a first sublayer of the combinationally doped semiconductor layer, the first sublayer being doped substantially with beryllium; and
   growing a second sublayer of the combinationally doped semiconductor layer, the second sublayer being doped substantially with carbon, the carbon-doped second semiconductor sublayer being grown disposed on the beryllium-doped first sublayer,
   wherein a semiconductor material of the first semiconductor sublayer and the second semiconductor sublayer comprise a III-V compound semiconductor, the combinationally doped semiconductor layer being a base layer of a heterojunction bipolar transistor.

15. The method of making a combinationally doped semiconductor layer of claim 14, wherein growing the first sublayer and growing the second sublayer comprise depositing the III-V compound semiconductor concurrently with the beryllium as a dopant at a first temperature and depositing the III-V compound semiconductor concurrently with the carbon as a dopant at a second temperature, the second temperature being lower than the first temperature.

16. The method of making a combinationally doped semiconductor layer of claim 15, further comprising growing a capping layer on a surface of the second sublayer, the capping layer being grown at a temperature of about the first temperature.

17. The method of making a combinationally doped semiconductor layer of claim 16, wherein the III-V compound semiconductor is indium gallium arsenide (InGaAs) and the capping layer comprises low temperature indium phosphide (InP).

18. The method of making a combinationally doped semiconductor layer of claim 14, wherein the III-V compound semiconductor of both the first and second semiconductor sublayers comprises indium gallium arsenide (InGaAs), the combinationally doped semiconductor layer being a base layer of a double heterojunction bipolar transistor (DHBT), the DHBT further comprising a collector layer disposed on a first side of the combinationally doped semiconductor base layer and an emitter layer disposed on a second side of the combinationally doped semiconductor base layer, the second side being opposite the first side.

19. The method of making a combinationally doped semiconductor layer of claim 14, wherein growing the first sublayer comprises growing the III-V compound semiconductor to a thickness of between about 250 angstroms (Å) and about 275 Å and with a beryllium dopant concentration of about $4.0 \times 10^{19}$ cm$^{-3}$, and wherein growing the second sublayer comprises growing the III-V compound semiconductor to a thickness between about 75 Å and about 100 Å and with a carbon dopant concentration of about $2.0 \times 10^{20}$ cm$^{-3}$.

20. A combinationally doped semiconductor layer comprising: a first sublayer of a semiconductor material doped substantially with beryllium; a second sublayer of the semiconductor material doped substantially with carbon, the carbon-doped second sublayer being disposed on the beryllium-doped first sublayer; and a capping layer on a surface of the combinationally doped semiconductor layer, wherein the semiconductor material of the first and second sublayers comprise a III-V compound semiconductor, wherein the capping layer has a thickness of between about 5 angstroms (Å) and about 50 Å.

* * * * *